(12) United States Patent
Luo et al.

(10) Patent No.: US 11,702,577 B2
(45) Date of Patent: Jul. 18, 2023

(54) HIGH THERMAL CONDUCTIVITY HYDROCARBON THERMAL MANAGEMENT FLUIDS FOR ELECTRIC VEHICLES

(71) Applicant: EXXONMOBIL TECHNOLOGY AND ENGINEERING COMPANY, Annandale, NJ (US)

(72) Inventors: Shuji Luo, Basking Ridge, NJ (US); Andrew E. Taggi, New Hope, PA (US); Kevin J. Kelly, Mullica Hill, NJ (US); Daniel Bien, Rheinland Pfalz (DE)

(73) Assignee: EXXONMOBIL TECHNOLOGY AND ENGINEERING COMPANY, Annandale, NJ (US)

( * ) Notice: Subject to any disclaimer, the term of this patent is extended or adjusted under 35 U.S.C. 154(b) by 0 days.

(21) Appl. No.: 17/340,638

(22) Filed: Jun. 7, 2021

(65) Prior Publication Data
US 2021/0395592 A1 Dec. 23, 2021

Related U.S. Application Data

(60) Provisional application No. 63/040,614, filed on Jun. 18, 2020.

(51) Int. Cl.
*C09K 5/10* (2006.01)
*H05K 7/20* (2006.01)

(52) U.S. Cl.
CPC .......... *C09K 5/10* (2013.01); *H05K 7/20* (2013.01)

(58) Field of Classification Search
CPC ... C09K 5/08; C09K 5/10; H01B 3/18; H01B 3/20; H01B 3/22; B60K 11/02; F28F 23/00; H01F 27/10; H01F 27/105; H01F 27/12; H01M 10/60; H01M 10/61; H01M 10/613; H02K 9/19
See application file for complete search history.

(56) References Cited

U.S. PATENT DOCUMENTS 3,595,797 A * 7/1971 Duling et al. .......... C10M 3/00
252/73
6,846,778 B2 * 1/2005 Johnson ............. C10M 101/025
585/7

(Continued)

FOREIGN PATENT DOCUMENTS

EP 3315590 A1 * 5/2018 ............ B60K 11/02
EP 3315590 A1 5/2018
(Continued)

OTHER PUBLICATIONS

The International Search Report and the Written Opinion of PCT/US2021/036159 dated Oct. 13, 2021.

*Primary Examiner* — Matthew R Diaz
(74) *Attorney, Agent, or Firm* — Vorys, Sater, Seymour and Pease LLP

(57) ABSTRACT

Disclosed are thermal management fluids for electric systems and methods of application. An example thermal management fluid may comprise: a base oil as a major component, wherein the base oil has both of the following enumerated properties: (i) a branch content of about 15 mol. % to about 30 mol. %; and (ii) a naphthene content of about 30 wt. % or less.

20 Claims, 2 Drawing Sheets

(56) References Cited

U.S. PATENT DOCUMENTS

| | | | | |
|---|---|---|---|---|
| 7,425,524 | B2* | 9/2008 | Haire | C10M 107/02 |
| | | | | 518/706 |
| 7,888,298 | B2* | 2/2011 | Poirier | C10M 145/16 |
| | | | | 508/363 |
| 10,501,670 | B2* | 12/2019 | Hahn | C09K 5/10 |
| 2005/0016899 | A1* | 1/2005 | Abazajian | C10G 50/02 |
| | | | | 208/58 |
| 2008/0011979 | A1* | 1/2008 | Davidson | C09K 5/10 |
| | | | | 252/73 |
| 2009/0001330 | A1* | 1/2009 | Arickx | H01B 3/22 |
| | | | | 252/570 |
| 2009/0036337 | A1* | 2/2009 | Deskin | H01B 3/22 |
| | | | | 508/567 |
| 2016/0230109 | A1* | 8/2016 | Wiersma | C10M 101/00 |
| 2017/0240832 | A1* | 8/2017 | Hahn | C10M 105/02 |
| 2019/0264121 | A1* | 8/2019 | China | B60K 11/02 |

FOREIGN PATENT DOCUMENTS

| | | | | |
|---|---|---|---|---|
| JP | 2012224862 A | * | 11/2012 | |
| WO | WO-2020007954 A1 | * | 1/2020 | C09K 5/048 |
| WO | WO2020007954 A1 | | 1/2020 | |

* cited by examiner

HIGH THERMAL CONDUCTIVITY HYDROCARBON THERMAL MANAGEMENT FLUIDS FOR ELECTRIC VEHICLES

CROSS-REFERENCE TO RELATED APPLICATIONS

This application claims the benefit of U.S. Provisional Application No. 63/040,614, filed on 18 Jun. 2020, the entire contents of which are incorporated herein by reference.

FIELD OF THE INVENTION

The present disclosure relates to thermal management fluids for electric components, and in particular, to thermal management fluids with a high thermal conductivity suitable for use in electric vehicles.

BACKGROUND

Heat transfer systems for electric vehicles may use thermal management fluids. These thermal management fluids may be aqueous solutions that indirectly remove generated heat from particular electric systems and components. Such aqueous thermal management fluids may not provide effective thermal management and heat transfer as electric vehicle technology and electric systems evolve to comprehend longer battery ranges, shorter recharging times, and higher vehicle power.

Direct thermal management may provide the effective thermal management of heat generated from hot surfaces. The effectiveness of thermal management fluids can be dependent on thermal conductivity. Thermal management effectiveness, as well as energy efficiency for thermal management fluid circulation, can be improved with the use of thermal management fluids with high thermal conductivity in direct thermal management applications. However, such electric vehicles and systems may be damaged by direct thermal management of aqueous thermal management fluids, which may include safety issues associated with the electrical conductivity of water, and the potential risk of hydrogen formation and release. Non-aqueous thermal management fluids, such as the hydrocarbon-based heat transfer fluids mentioned in this disclosure, may provide benefits with respect to both direct thermal management of hot component surfaces and safety based on the low electrical conductivity of the non-aqueous thermal management fluid. For example, direct immersive cooling of this sort may help reduce the risk of uncontrolled thermal runaway within battery modules in which one battery cell is compromised through short circuiting or physical damage.

There remains a need for a thermal management fluid with high thermal conductivity that effectively maximizes heat removal while also minimizing the amount of power required for thermal management fluid circulation.

SUMMARY

Disclosed herein is an example thermal management fluid for use in an electric system comprising a base oil as a major component, wherein the base oil has both of the following enumerated properties: (i) a branch content of about 15 mol. % to about 30 mol. %; and (ii) a naphthene content of about 30 wt. % or less.

Further disclosed herein is an example method of cooling an electric system, comprising circulating a thermal management fluid into a contact with one or more components of the electric system to remove heat from the one or more components, wherein the thermal management fluid comprises a base oil as a major component, wherein the base oil has both of the following enumerated properties: (i) a branch content of about 15 mol. % to about 30 mol. %; and (ii) a naphthene content of about 30 wt. % or less.

BRIEF DESCRIPTION OF THE DRAWINGS

The drawings illustrate certain aspects of the present disclosure and should not be used to limit or define the disclosure.

DETAILED DESCRIPTION

Figure 1:
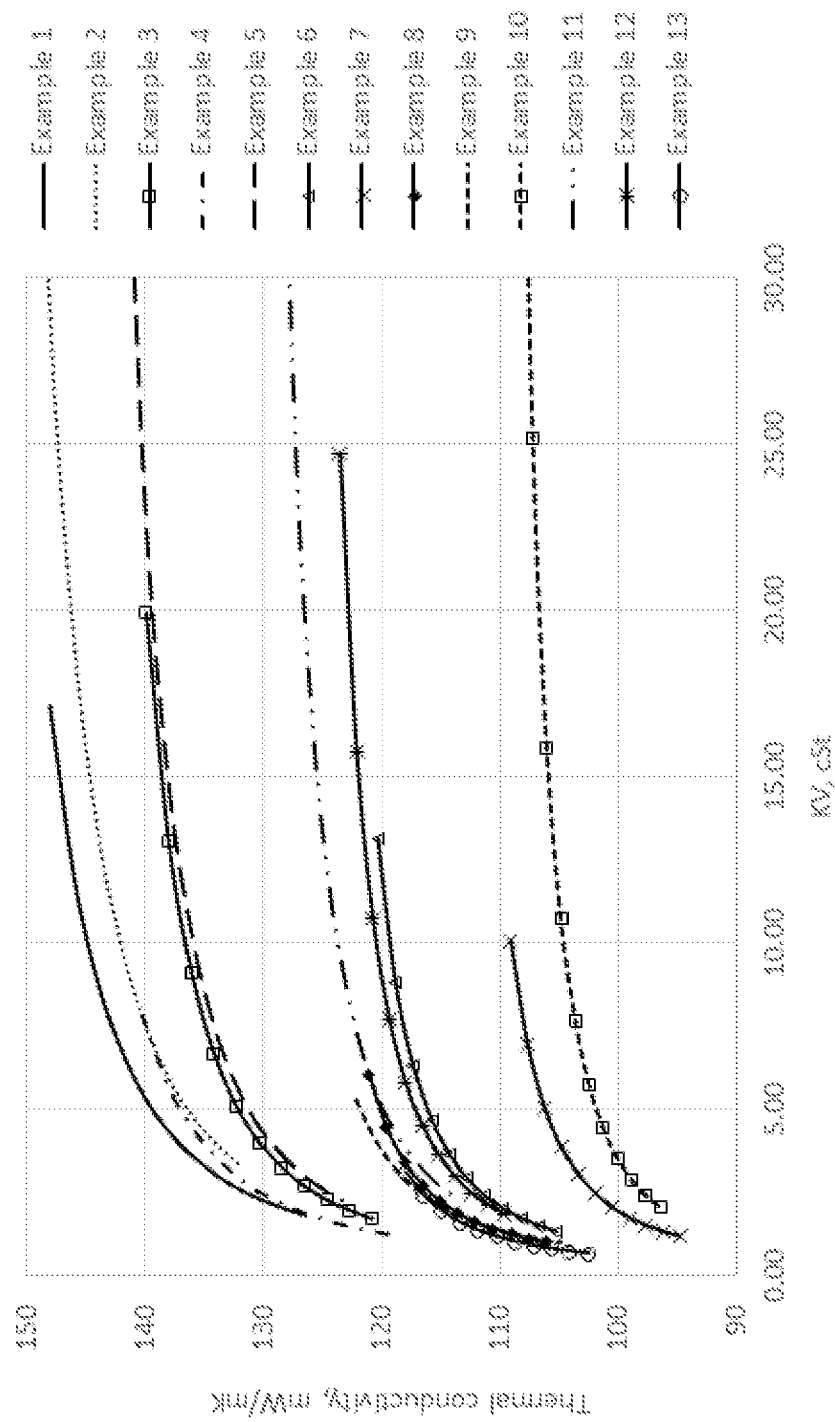
FIG. 1 is a graph showing thermal conductivity versus kinematic viscosity for various hydrocarbon fluid samples.

The following is a detailed description of the disclosure provided to aid those skilled in the art in practicing the present disclosure. Those of ordinary skill in the art may make modifications and variations in the embodiments described herein without departing from the spirit or scope of the present disclosure. Unless otherwise defined, all technical and scientific terms used herein have the same meaning as commonly understood by one of ordinary skill in the art to which this disclosure belongs. The terminology used in the description of the disclosure herein is for describing particular embodiments only and is not intended to be limiting of the disclosure. All publications, patent applications, patents, figures, and other references mentioned herein are expressly incorporated by reference in their entirety.

The phrases "electric system," "electric device," "electrical system, "electrical device," and any variant thereof, refers to any system, device, or apparatus primarily powered or operated through electrical means and requiring a heat transfer system to remove generated heat for prolonged operation. Example electric systems include, but are not limited to, an electric vehicle, power electronics included in an electric vehicle (e.g., "on-board" electronics), an electric motor, a battery, a rechargeable battery system, a charging station, electronic equipment, a computer, a server bank (or farm), a data center, or any combination thereof.

"Electric vehicle," and any variant thereof, refers to all-electric and fully electric vehicles, and hybrid and hybrid electric vehicles, which may have any of a variety of parallel or series drivetrain configurations, alone or in combination, and includes the mechanical and electrical systems, subsystems, and components having gears used in the vehicles. These mechanical and electrical systems, subsystems and components having gears can include, for example, electrical vehicle powertrains, powertrain components, drivetrain components, kinetic energy recovery systems (KERS), energy regenerative systems, and the like. The terms electric vehicle and hybrid vehicle may be used interchangeably. Moreover, the term "electric vehicle" is not limited to land-bound vehicles (e.g., automobiles), but is also intended to encompass any type of vehicle that is fully or partially powered electrically and includes aviation vehicles (e.g., airplanes, drones, spacecraft, etc.) and nautical vehicles (e.g., any type of water craft, hovercraft, etc.). "Electric vehicle" can also refer to manually driven or autonomous vehicles, or any hybrid thereof.

The present disclosure relates to thermal management fluids for electric systems, and in one or more implementations, to a screening method for suitable liquid thermal management fluids. In electric vehicle applications, the performance of a thermal management fluid is governed by its ability to remove heat from hot surfaces and by the amount of power required to circulate the thermal management fluid. An ideally suited thermal management fluid should maximize heat removal across a hot surface and minimize the minimum power to circulate through the system. In accordance with present embodiments, the thermal management fluids may include a base oil and optionally one or more additional additives. These thermal management fluids have thermal, physical, and chemical properties which should allow them to be suitable for the thermal management of electric systems. In this disclosure, the term thermal management fluid encompasses lubricating oils, lubricating fluids, lubricants, lubricant oils, working fluids, thermal management oils, thermal management fluids, non-aqueous dielectric coolant; such terms may be used interchangeably.

In the embodiments, the ability for a thermal management fluid to remove heat across a hot surface is its thermal conductivity. The thermal conductivity of a thermal management fluid is a property of measure imparting satisfactory thermal management in electric systems. Heat transfer may occur at a lower rate in fluids of lower thermal conductivity than in materials of higher thermal conductivity. When comparing different families of thermal management fluids, the thermal conductivity may increase with the increase of the fluid's flow characteristics, such as kinematic viscosity. However, when comparing different thermal management fluids of similar flow characteristics, such as kinematic viscosity, thermal conductivity does not present a direct and explicit correlation with the fluids' flow characteristics. However, underlying chemical properties of the thermal management fluid may instead provide evidence as to the nature of its thermal conductivity.

As used herein, the terms "thermal conductivity" of a thermal management fluid refers to values measured from heat flow through a fluid as measured in accordance with ASTM D7896 or a similar method derived from ASTM D7896. In some embodiments, the thermal management fluid may have a thermal conductivity at 40° C. of about 0.15 (W/mK) or less, or about 0.14 W/mK or less, or about 0.13 W/mK or less, or about 0.12 W/mK or less. In some embodiments, the thermal management fluid may have a thermal conductivity at 40° C. of about 0.1 W/mK to about 0.15 W/mK, or about 0.1 W/mK to about 0.11 W/mK, or about 0.11 W/mK to about 0.13 W/mK, or about 0.12 W/mK to about 0.14 W/mK.

There may be a variety of physicochemical properties of thermal management fluids that affect overall thermal management performance, which may affect the efficiency of heat removal across a hot surface, such as the thermal conductivity. The properties may influence the thermochemical performance of the fluid (e.g. heat transfer) or the physical performance (e.g. flow characteristic). These thermal management fluid properties may include, but are not limited to, structural chemistry of the thermal management fluid composition, branch and naphthene content, and flow and physical properties.

Compositions of the present invention and the properties of the compositions may be evaluated independently. A suitable thermal management fluid may meet at least one property and at least one composition as disclosed herein.

The branch content (BC) of the base oil in a thermal management fluid is a property of the hydrocarbon components of the thermal management fluid that may affect the overall thermal management performance of the thermal management fluid in electric systems. The base oil in the thermal management fluid include hydrocarbons having linear chains where a primary carbon is bound to only one other carbon atom or be branched chains where a carbon may be bound to more than one other carbon. The branched chain carbon may be a secondary, tertiary, or quaternary carbon binding to two, three, or four other carbons, respectively. As used herein, branch content may also refer to a tertiary carbon content of the base oil in the thermal management fluid. Branch content may correlate to the physical properties of the thermal management fluid. Branched chain hydrocarbons determine the flow properties of the thermal management fluid based on the length and the degree of branching. The longer and higher degree of branching of the hydrocarbons in the base oil may increase physical properties, such as the kinematic viscosity of the thermal management fluid, as the branching provides greater opportunities for molecular entanglements within the fluid.

The branch content of a base oil in the thermal management fluid is calculated based on proton nuclear magnetic resonance (NMR) peak integrations, gas chromatography (GC), and paraffin/naphthene analysis. As used herein, the branch content is determined based on the following equation:

$$BC = \frac{a*[(2n+2)*(1-x)+2nx]}{3*(a+b)*n} - \frac{2}{n} \qquad \text{Equation (1)}$$

wherein a is a proton NMR methyl peak integral, b is a proton NMR methine/methylene peak integral, n is an average carbon number by GC, and x is a naphthene content. The naphthene content may be determined by a hydrocarbon characterization analysis based on ASTM D2786.

Branch content of the hydrocarbons may be present in any amount suitable for a thermal management application. Branch content of the hydrocarbons is measured based on the molar fraction or mole % of the hydrocarbons in the thermal management fluid obtained from Equation (1). For example, without limitation, the branch content of the base oil in the thermal management fluid may be present at a point ranging from about 15 mol. % to about 30 mol. % based on the branch content function. Alternatively, the branch content of the base oil may be present a point ranging from about 15 mol. % to about 25 mol. %, at a point ranging from about 15 mol. % to about 20 mol. %, at a point ranging from about 20 mol. % to 30 mol. %, or at a point ranging from about 25 mol. % to about 30 mol. %. One of ordinary skill in the art with the benefit of this disclosure should be able to calculate and select an appropriate branch content of the base oil for a thermal management fluid.

The kinematic viscosity of the thermal management fluid is a physical property that may affect overall thermal management performance in electric systems. As used herein, the viscosity is determined in accordance with ASTM D445. The kinematic viscosity is the product of the measured flow time and the calibration constant of a viscometer. The higher the flow property of the thermal management fluid such as kinematic viscosity, the more power required to circulate the thermal management fluid across the electric vehicle and electric systems. While a higher kinematic viscosity may not necessarily implicate a higher thermal conductivity to remove heat across a hot surface, it may be important to consider kinematic viscosity of the thermal management fluids to ensure proper circulation across the system.

As used herein, the terms "kinematic viscosity at 40° C." or "KV40" of a thermal management fluid refers to the kinematic viscosity at 40° C. as measured in accordance with ASTM D445. In some embodiments, the thermal management fluid may have a KV40 of about 15 centistokes (cSt) or less, or about 8 cSt or less, or about 6 cSt or less, or about 4 cSt or less, or about 2 cSt or less. In some embodiments, the thermal management fluid may have a KV40 of about 1 cSt to about 5 cSt, or about 2 cSt to about 4 cSt, or about 5 cSt to about 10 cSt, or about 1 cSt to 15 cSt. In some embodiments, the thermal management fluid may have a KV40 of about 15 $mm^2/s$ or less, or about 8 $mm^2/s$ or less, or about 6 $mm^2/s$ or less, or about 4 $mm^2/s$ or less, or about 2 $mm^2/s$ or less. In some embodiments, the thermal management fluid may have a KV40 of about 1 $mm^2/s$ to about 5 $mm^2/s$, or about 2 $mm^2/s$ to about 4 $mm^2/s$, or about 5 $mm^2/s$ to about 10 $mm^2/s$, or about 1 $mm^2/s$ to 15 $mm^2/s$.

The naphthene content of the thermal management fluid is a property that may affect overall thermal management performance in electric systems. As used herein, the naphthene content may be determined in accordance with ASTM D2786 by a hydrocarbon characterization analysis. Various techniques including, but not limited to proton nuclear magnetic resonance (NMR), gas chromatography (GC), and spectroscopy, may provide information on the specified components in the thermal management fluid. In some embodiments, the thermal management fluid may have a naphthene content of less than or equal to 30 wt. %, or less than or equal to 25 wt. %, or less than or equal to 20 wt. %, or less than or equal to 15 wt. %, or less than or equal to 10 wt. %, or less than or equal to 5 wt. %.

The density of the thermal management fluid may be another fluid property for imparting satisfactory heat transfer performance in electric systems. As used herein, the density may be determined in accordance with ASTM D4052. In some embodiments, at a temperature of 40° C., the thermal management fluid may have a density of about 0.25 g/mL to about 1.75 g/mL, or from about 0.30 g/mL to about 1.70 g/mL, or about 0.35 g/mL to about 1.65 g/mL, or about 0.40 g/mL to about 1.60 g/mL, or about 0.45 g/mL to about 1.55 g/mL. In another embodiment, at a temperature of 80° C., the thermal management fluids may have a density of about 0.25 g/mL to about 1.75 g/mL, or about 0.30 g/mL to about 1.70 g/mL, or about 0.35 g/mL to about 1.65 g/mL, or about 0.40 g/mL to about 1.60 g/mL, or about 0.45 g/mL to about 1.55 g/mL.

The specific heat of the thermal management fluid may be another fluid property for imparting satisfactory heat transfer performance in electric systems. As used herein, the specific heat may be determined in accordance with ASTM E1269. In some embodiments, at a temperature of 40° C., the thermal management fluids may have a specific heat of about 1.25 kJ/kg·K to about 3.50 kJ/kg·K, or about 1.35 kJ/kg·K to about 3.40 kJ/kg·K, or about 1.45 kJ/kg·K to about 3.25 kJ/kg·K, or about 1.50 kJ/kg·K to about 3.20 kJ/kg·K, or about 1.55 kJ/kg·K to about 3.15 kJ/kg·K. In another embodiment, at a temperature of 80° C., the thermal management fluids may have a specific heat of about 1.25 kJ/kg·K to about 3.50 kJ/kg·K, or about 1.35 kJ/kg·K to about 3.40 kJ/kg·K, or about 1.45 kJ/kg·K to about 3.25 kJ/kg·K, or about 1.50 kJ/kg·K to about 3.20 kJ/kg·K, or about 1.55 kJ/kg·K to about 3.15 kJ/kg·K.

The dynamic viscosity of the thermal management fluid may be another fluid property for imparting satisfactory heat transfer performance in electric systems. As used herein, the dynamic viscosity may be determined in accordance with ASTM E1269 where the kinematic viscosity is multiplied by density at a given temperature. In some embodiments, where the average fluid temperature may be 40° C., the thermal management fluids may have a dynamic viscosity about 0.50 centipoise (cP) to about 7.50 cP, or about 0.55 cP to about 7.00 cP, or about 0.65 cP to about 6.50 cP, or about 0.70 cP to about 6.00 cP, or about 0.75 cP to about 5.50 cP. In another embodiment, where the average fluid temperature may be 80° C., the thermal management fluids may have a dynamic viscosity about 0.50 cP to about 7.50 cP, or about 0.55 cP to about 7.00 cP, or about 0.65 cP to about 6.50 cP, or about 0.70 cP to about 6.00 cP, or about 0.75 cP to about 5.50 cP.

The thermal management fluids mentioned herein provide sustained thermal management fluid properties over the lifetime of the thermal management fluid, and compatibility with the electrical systems mentioned herein, e.g., an electric vehicle and its components and materials. Illustrative electric system and electric vehicle components that can be cooled in accordance with this disclosure include, for example, electric vehicle batteries, electric motors, electric generators, AC-DC/DC-AC/AC-AC/DC-DC converters, AC-DC/DC-AC/AC-AC/DC-DC transformers, power management systems, electronics controlling batteries, on-board chargers, on-board power electronics, super-fast charging systems, fast charging equipment at charging stations, stationary super-fast chargers, and the like.

Depending on the particular electric system (e.g., electric vehicle batteries, electric motors, electric generators, AC-DC/DC-AC/AC-AC/DC-DC converters, AC-DC/DC-AC/AC-AC/DC-DC transformers, power management systems, electronics controlling batteries, on-board chargers, on-board power electronics, super-fast charging systems, fast charging equipment at charging stations, stationary super-fast chargers, and the like), the electric system can operate over a wide temperature range. For example, the electric system can operate at a temperature between about −40° C. and about 175° C., or between about −25° C. and about 170° C., or between about −10° C. and about 165° C., or between about 0° C. and about 160° C., or between about 10° C. and about 155° C., or between about 25° C. and about 150° C., or between about 25° C. and about 125° C., or between about 30° C. and about 120° C., or between about 35° C. and about 115° C., or between about 35° C. and about 105° C., or between about 35° C. and about 95° C., or between about 35° C. and about 85° C.

In an embodiment, a single thermal management fluid can be used in the electric system. In another embodiment, more than one thermal management fluid can be used in the electric system, for example, one thermal management fluid for the battery and another thermal management fluid for another component of the electric system.

The thermal management fluids mentioned herein provide thermal management on surfaces of apparatus components that include, for example, the following: metals, metal alloys, non-metals, non-metal alloys, mixed carbon-metal composites and alloys, mixed carbon-nonmetal composites and alloys, ferrous metals, ferrous composites and alloys, non-ferrous metals, non-ferrous composites and alloys, titanium, titanium composites and alloys, aluminum, aluminum composites and alloys, magnesium, magnesium composites and alloys, ion-implanted metals and alloys, plasma modified surfaces; surface modified materials; coatings; mono-layer, multi-layer, and gradient layered coatings; honed surfaces; polished surfaces; etched surfaces; textured surfaces; micro and nano structures on textured surfaces; super-finished surfaces; diamond-like carbon (DLC), DLC with high-hydrogen content, DLC with moderate hydrogen content, DLC with low-hydrogen content, DLC with near-zero hydrogen content, DLC composites, DLC-metal compositions and composites, DLC-nonmetal compositions and composites; ceramics, ceramic oxides, ceramic nitrides, FeN, CrN, ceramic carbides, mixed ceramic compositions, and the like; polymers, thermoplastic polymers, engineered polymers, polymer blends, polymer alloys, polymer composites; materials compositions and composites, that include, for example, graphite, carbon, molybdenum, molybdenum disulfide, polytetrafluoroethylene, polyperfluoropropylene, polyperfluoroalkylethers, and the like.

As previously described, the thermal management fluid may be used for thermal management of electric systems in accordance with present embodiments. The thermal management fluids disclosed herein provide may provide sustained thermal management fluid properties over the lifetime of the thermal management fluid, and compatibility with the electrical systems mentioned herein, e.g., an electric motor, electric vehicle, and their corresponding components and materials. Illustrative electric system components that can be cooled in accordance with this disclosure include, for example, electric batteries, electric motors, electric generators, AC-DC/DC-AC/AC-AC/DC-DC converters, AC-DC/DC-AC/AC-AC/DC-DC transformers, power management systems, electronics controlling batteries, on-board chargers, on-board power electronics, super-fast charging systems, fast charging equipment at charging stations, stationary super-fast chargers, and the like.

Depending on the particular electric system (e.g., electric batteries, electric motors, electric generators, AC-DC/DC-AC/AC-AC/DC-DC converters, AC-DC/DC-AC/AC-AC/DC-DC transformers, power management systems, electronics controlling batteries, on-board chargers, on-board power electronics, super-fast charging systems, fast charging equipment at charging stations, stationary super-fast chargers, and the like), the electric system can operate over a wide temperature range. For example, the electric system can operate at a temperature between about −40° C. and about 175° C., or between about −25° C. and about 170° C., or between about −10° C. and about 165° C., or between about 0° C. and about 160° C., or between about 10° C. and about 155° C., or between about 25° C. and about 150° C., or between about 25° C. and about 125° C., or between about 30° C. and about 120° C., or between about 35° C. and about 115° C., or between about 35° C. and about 105° C., or between about 35° C. and about 95° C., or between about 35° C. and about 85° C.

In an embodiment, a single thermal management fluid can be used in the electric system. In another embodiment, more than one heat thermal management fluid can be used in the electric system, for example, one heat transfer fluid for the battery and another heat transfer fluid for another component of the electric system.

The thermal management fluids mentioned herein may be used on surfaces of apparatus components that include, for example, the following: metals, metal alloys, non-metals, non-metal alloys, mixed carbon-metal composites and alloys, mixed carbon-nonmetal composites and alloys, ferrous metals, ferrous composites and alloys, non-ferrous metals, non-ferrous composites and alloys, titanium, titanium composites and alloys, aluminum, aluminum composites and alloys, magnesium, magnesium composites and alloys, ion-implanted metals and alloys, plasma modified surfaces; surface modified materials; coatings; mono-layer, multi-layer, and gradient layered coatings; honed surfaces; polished surfaces; etched surfaces; textured surfaces; micro and nano structures on textured surfaces; super-finished surfaces; diamond-like carbon (DLC), DLC with high-hydrogen content, DLC with moderate hydrogen content, DLC with low-hydrogen content, DLC with near-zero hydrogen content, DLC composites, DLC-metal compositions and composites, DLC-nonmetal compositions and composites; ceramics, ceramic oxides, ceramic nitrides, FeN, CrN, ceramic carbides, mixed ceramic compositions, and the like; polymers, thermoplastic polymers, engineered polymers, polymer blends, polymer alloys, polymer composites; materials compositions and composites, that include, for example, graphite, carbon, molybdenum, molybdenum di sulfide, polytetrafluoroethylene, polyperfluoropropylene, polyperfluoroalkylethers, and the like.

In some embodiments, the electric systems may include an oil thermal management system. An example of an oil thermal management system may include one or more conduits and a pump configured to circulate the thermal management fluid through the one or more conduits. The pump may include, for example, a positive displacement pump or a centrifugal pump. The thermal management fluid may include any of the thermal management fluids disclosed herein and may be used to cool an electric system component (e.g., electric motor, electric battery) that forms part of an electric system. In some embodiments, the thermal management fluid may be configured to directly cool one or more surfaces of the electric system component to thereby draw heat away from the electric system component. After exchanging heat with the electric system component, the warmed thermal management fluid may be conveyed away from the electric system component 108 at an elevated temperature. The warmed thermal management fluid may be then conveyed within the conduit(s) to a heat exchanger included in the oil thermal management system. The heat exchanger may operate similar to a radiator by drawing heat away from the warmed thermal management fluid. In some embodiments, the heat exchanger may reject heat to another fluid or to air at ambient temperature, for example. The heat exchanger may be a specific device, or simply heat lost to the atmosphere as the heat transfer fluid flows through the conduit(s). The thermal management fluid may then be recirculated to the electric system component. These descriptions of the electric coolant system are merely examples and that the thermal management fluid can be used with any suitable electric thermal management system for thermal management of electric system components.

One or more embodiments of an oil thermal management system may include circulation of the thermal management fluid into contact with the one or more components of the electric system, such as an electric batter or electric motor. The thermal management fluid may absorb heat from the electric system component to thereby cool the electric system component by heat removal. Suitable oil thermal management systems may include surface thermal management and/or internal thermal management of the electric motor. One or more embodiments of an oil thermal management system that uses surface thermal management may circulate the thermal management fluid through a thermal management jacket on the outside of the motor stator. One or more embodiments of an oil thermal management system that uses internal thermal management may circulate the thermal management fluid through the electric system component. By circulation through the electric system component, such as an electric motor, the thermal management fluid may function to lubricate the electric system component (e.g., motor bearings) in addition to thermal management. In some embodiments, surface and internal thermal management techniques can be combined. However, it should be understood that these descriptions of thermal management techniques are merely examples and that the thermal management fluid can be used in accordance with other techniques for thermal management of an electric motor.

Base Oils

Example embodiments of the thermal management fluids may include one or more base oils. Suitable base oils such as alkanes, paraffins, synthetic oils, and unconventional oils, or mixtures thereof may be used. Unrefined, refined, or rerefined (the latter may also be known as reclaimed or reprocessed) oils may be used. Unrefined oils are those obtained directly from a natural or synthetic source and used without added purification. These include shale oil obtained directly from retorting operations, petroleum oil obtained directly from primary distillation, and ester oil obtained directly from an esterification process. Refined oils are similar to the oils discussed for unrefined oils except refined oils are subjected to one or more purification steps to improve at least one thermal management fluid base oil property. One of ordinary skill in the art may be familiar with many purification processes. These processes include solvent extraction, secondary distillation, acid extraction, base extraction, filtration, and percolation. Rerefined oils are obtained by processes analogous to refined oils but using an oil that has been previously used as a feedstock.

Synthetic oils include oils such as polymerized and interpolymerized olefins (polybutylenes, polypropylenes, propylene isobutylene copolymers, ethylene-olefin copolymers, and ethylene-alphaolefin copolymers, for example). Polyalphaolefin (PAO) oil base stocks are commonly used synthetic hydrocarbon oil. By way of example, PAOs derived from $C_8$, $C_{10}$, $C_{12}$, $C_{14}$ olefins or mixtures thereof may be utilized. The PAOs may include relatively low molecular weight hydrogenated polymers or oligomers of alphaolefins which include, but are not limited to, $C_2$ to about $C_{32}$ alphaolefins with the $C_8$ to about $C_{16}$ alphaolefins, such as 1-octene, octene, 1-decene, decene, 1-dodecene and the like. Examples of suitable polyalphaolefins are poly-1-octene, poly-1-decene and poly-1-dodecene and mixtures thereof and mixed olefin-derived polyolefins. However, the dimers of higher olefins in the range of $C_{14}$ to $C_{18}$ may be used to provide low viscosity base stocks of acceptably low volatility. Depending on the viscosity grade and the starting oligomer, the PAOs may be predominantly trimers and tetramers of the starting olefins, with minor amounts of the higher oligomers. Exemplary PAO trimers and tetramers may include but not limited to octene trimers, decene trimers and the like, and may have a viscosity range of 1.5 cSt to 14 cSt. Mixtures of PAO fluids having a viscosity range of 1.5 cSt to approximately 350 cSt or more may be used if desired. In some embodiments, the PAOs may have a KV40 range of about 1.5 $mm^2/s$ to about 14 $mm^2/s$.

The PAO fluids may be conveniently made by the polymerization of an alphaolefin in the presence of a polymerization catalyst such as the Friedel-Crafts catalysts including, for example, aluminum trichloride, boron trifluoride or complexes of boron trifluoride with water, alcohols such as ethanol, propanol or butanol, carboxylic acids or esters such as ethyl acetate or ethyl propionate.

The base oil may also include a paraffin. Paraffins may occur as acyclic, straight or branched polymeric chains of alkanes. Paraffins may be derived from alkanes with $C_{10}$ to $C_{20}$ hydrocarbons, or from $C_{16}$ to $C_{20}$ hydrocarbons. Paraffins may have a functionalized group such as an alkyl functional group. In particular, the alkyl functional group may be a methyl group, and the paraffin may be a methyl paraffin. Alkanes or paraffins may have very low sulfur and nitrogen content, containing less than about 10 ppm, or less than about 5 ppm of each of these elements.

The base oil may also include hydrocarbon fluids. The hydrocarbon fluids may include, but not limited to, hydrocarbons such as n-paraffins and isoparaffins, naphthenes, and any combinations thereof. The hydrocarbon fluids may be derived from $C_{12}$ to $C_{16}$ hydrocarbons, or $C_{13}$ to $C_{18}$ hydrocarbons, $C_{14}$ to $C_{20}$ hydrocarbons, $C_{14}$ to $C_{25}$ hydrocarbons, and any combinations thereof. The n-paraffinic and isoparaffinic hydrocarbon fluids may further be purified by a hydrogenation process to produce a low odor, low aromatic hydrocarbon fluid. Aromatic content of the paraffinic fluids may be about 0.01% by weight to about 3% by weight of the hydrocarbon fluid or may be less than about 2% by weight of the hydrocarbon fluid. The paraffinic hydrocarbon fluids may include chains of hydrocarbons, may be saturated and unsaturated, and may be linear chains and branched. The naphthene hydrocarbons may include a group of cyclical hydrocarbons. Hydrocarbon fluids with a mixture of all three hydrocarbons may include linear chained hydrocarbons and cyclic hydrocarbons. The hydrocarbon fluids may have low sulfur and nitrogen content, containing less than about 10 ppm, or less than about 5 ppm of each of these elements.

The base oil may constitute the major component of the thermal management fluid of the present disclosure and may be present in an amount ranging from about 50 wt. % to about 100 wt. %, for example, from about 70 wt. % to about 90 wt. % or from about 85 wt. % to about 95 wt. %, or from about 85 wt. % to about 99 wt. % or from about 90 wt. % to about 100 wt. % based on the total weight of the thermal management fluid.

Figure 2:
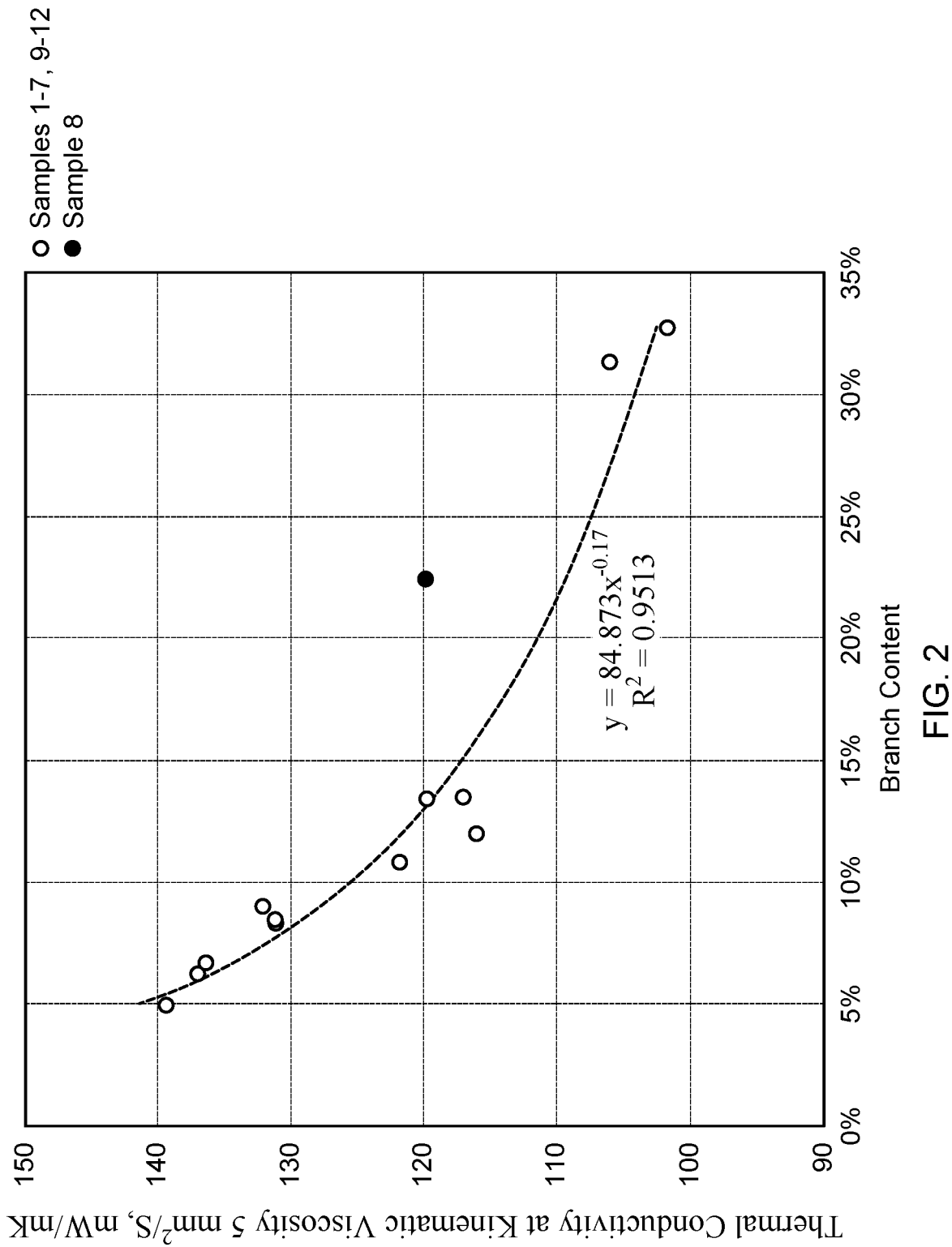
FIG. 2 is a graph showing thermal conductivity at kinematic viscosity 5 $mm^2/s$ versus branch content for various hydrocarbon fluid samples.

Measurements of the thermal conductivity and kinematic viscosity of the base oils may be performed to determine suitability as a thermal management fluid. In addition to branch content, previously discussed, a thermal conductivity at 5 $mm^2/s$ regression model may be developed. The thermal conductivity at 5 $mm^2/s$ (TC) may be a linear regression based on (1) the thermal conductivity measurement at 0° C. to 100° C. by ASTM D7896 or similar methods derived from ASTM D7896, and (2) the temperature at which kinematic viscosity is 5 $mm^2/s$ calculated by ASTM D341 based on kinematic viscosity measurements at 40° C. and 100° C. FIG. 2 illustrates an exemplary model of the regression.

From the regression model, a predicted thermal conductivity at 5 $mm^2/s$ may be calculated by the following equation:

$$TC_{Pred} = 84.873 * (BC)^{-0.17} \quad \text{Equation (2)}$$

wherein the predicted thermal conductivity at 5 $mm^2/s$ ($TC_{Pred}$) is measured in mW/mK and BC is the branch content calculated from Equation 1. From the predicted thermal conductivity and a measured thermal conductivity (TC), a deviation of the thermal conductivity at 5 $mm^2/s$ ($TC_{Dev}$) may be calculated by the following equation:

$$TC_{Dev} = \frac{TC - TC_{Pred}}{TC_{Pred}} * 100\% \quad \text{Equation (3)}$$

wherein the deviation of thermal conductivity at 5 $mm^2/s$ ($TC_{Dev}$) is a percentage, TC is the measured thermal conductivity of the fluid at 5 $mm^2/s$, and $TC_{Pred}$ is the predicted thermal conductivity at 5 $mm^2/s$.

Other Additives

The thermal management fluid may also include one or more other additives, such as those used for engine oils. These other additives may include any one or more antioxidants, viscosity modifiers, friction modifiers, anti-wear additives, detergents, pour point depressant, corrosion inhibitors, anti-rust additives, metal deactivators, seal compatibility additives, and antifoam agents. The antioxidants may include, but not limited to phenol-based and amine-based antioxidants, and combinations thereof. The phenol-based antioxidants may be present in amount of about 0.25 wt. % to about 0.5 wt. %, or in an amount greater than or equal to 0.5 wt. % of the thermal management fluid. The amine-based antioxidant may be present in an amount of about 0.1 wt. % to about 0.2 wt. %, or in an amount greater than equal to 0.2 wt. % of the thermal management fluid.

Accordingly, the preceding description describes thermal management fluids with a high thermal conductivity for use in electric components. The foregoing thermal management fluids can further include any one or more of the following embodiments:

Embodiment 1

A thermal management fluid for use in an electric system comprising: a base oil as a major component, wherein the base oil has both of the following enumerated properties: (i) a branch content of about 15 mol. % to about 30 mol. %; and (ii) a naphthene content of about 30 wt. % or less.

Embodiment 2

The thermal management fluid of embodiment 1, wherein the electric system is part of an electric vehicle.

Embodiment 3

The thermal management fluid of embodiment 1 or 2, wherein the electric system comprises an electric motor.

Embodiment 4

The thermal management fluid of embodiments 1-3, wherein the electric system comprises a battery.

Embodiment 5

The thermal management fluid of any one of embodiments 1-4, wherein fluid is in direct contact with one or more electrified components of the electric system to remove heat from them.

Embodiment 6

The thermal management fluid of any one of embodiments 1-5, wherein the base oil has a KV40 of about 15 $mm^2/s$ or less.

Embodiment 7

The thermal management fluid of any one of embodiments 1-6, wherein the branch content of the base oil is about 15 mol. % to about 25 mol. %.

Embodiment 8

The thermal management fluid of any one of embodiments 1-7, wherein the naphthene content of the base oil is about 25 wt. % or less.

Embodiment 9

The thermal management fluid of any one of embodiments 1-8, wherein the thermal management fluid has a thermal conductivity of about 110 mW/mK or greater at a kinematic viscosity of 5 $mm^2/s$.

Embodiment 10

The thermal management fluid of any one of embodiments 1-9, wherein the thermal management fluid has a thermal conductivity at kinematic viscosity of 5 $mm^2/s$ at least about 3% greater than a predicted thermal conductivity by the equation: $TC_{pred}=84.873*(BC)^{-0.17}$, wherein $TC_{Pred}$ is the predicted thermal conductivity measured in mW/mK, and BC is the branch content of the thermal management fluid.

Embodiment 11

The thermal management fluid of any one of embodiments 1-10, wherein the thermal management fluid has a thermal conductivity at kinematic viscosity of 5 $mm^2/s$ at least about 5% greater than a predicted thermal conductivity by the equation: $TC_{Pred}=84.873*(BC)^{-0.17}$, wherein $TC_{Pred}$ is the predicted thermal conductivity measured in mW/mK, and BC is the branch content of the thermal management fluid.

Embodiment 12

The thermal management fluid of any one of embodiments 1-11, further comprising one or more additives selected from the group consisting of an antioxidant, a corrosion inhibitor, an antifoam agent, an anti-wear additive, a dispersant, a detergent, a viscosity modifier, and any combination thereof.

Embodiment 13

The thermal management fluid of any one of embodiments 1-12, further comprising: at least one phenol-based antioxidant present in an amount of about 0.25 wt. % or greater, and at least one amine-based antioxidant present in an amount of about 0.1 wt. % or greater.

Embodiment 14

The thermal management fluid of any one of embodiments 1-13, further comprising: at least one phenol-based antioxidant present in an amount of about 0.5 wt. % or greater, and at least one amine-based antioxidant present in an amount of about 0.2 wt. % or greater.

Embodiment 15

A method of cooling an electric system, comprising: circulating a thermal management fluid into a contact with one or more components of the electric system to remove heat from the one or more components, wherein the thermal management fluid comprises a base oil as a major component, wherein the base oil has both of the following enumerated properties: (i) a branch content of about 15 mol. % to about 30 mol. %; and (ii) a naphthene content of about 30% or less.

Embodiment 16

The method of embodiment 15, wherein the electric system is part of an electric vehicle.

Embodiment 17

The method of embodiment 15 or 16, wherein the one or more components comprise an electric motor.

Embodiment 18

The method of embodiments 15-17, wherein the one or more components comprise a battery.

Embodiment 19

The method of any one of embodiments 15-18, wherein the contact is a direct contact with the electric system for heat removal.

Embodiment 20

The method of any one of embodiments 15-19, wherein the circulating further comprises circulating the thermal management fluid through a heat exchanger to draw heat away from the cooling fluid after the thermal management fluid has contacted the one or more components of the electric system.

Embodiment 21

The method of any one of embodiments 15-20, wherein the thermal management fluid has a thermal conductivity at kinematic viscosity of 5 mm²/s at least about 3% greater than a predicted thermal conductivity by the equation: $TC_{Pred}=84.873*(BC)^{-0.17}$, wherein $TC_{Pred}$ is the predicted thermal conductivity measured in mW/mK, and BC is the branch content of the thermal management fluid.

Embodiment 22

The method of any one of embodiments 15-21, further comprising one or more additives selected from the group consisting of an antioxidant, a corrosion inhibitor, an antifoam agent, an anti-wear additive, a dispersant, a detergent, a viscosity modifier, and any combination thereof.

Embodiment 23

The method of any one of embodiments 15-22, further comprising: at least one phenol-based antioxidant present in an amount of about 0.25 wt. % or greater, and at least one amine-based antioxidant present in an amount of about 0.1 wt. % or greater.

Embodiment 24

The method of any one of embodiments 15-23, further comprising: at least one phenol-based antioxidant present in an amount of about 0.5 wt. % or greater, and at least one amine-based antioxidant present in an amount of about 0.2 wt. % or greater.

Embodiment 25

The method of any one of embodiments 15-24, wherein the base oil has a KV40 of about 15 mm²/s or less, a branch content of about 15 mol. % to about 25 mol. %, and a naphthene content of about 25 wt. % or less

EXAMPLES

To facilitate a better understanding of the present invention, the following examples of certain aspects of some embodiments are given. In no way should the following examples be read to limit, or define, the entire scope of the invention.

Example 1

This example was performed to illustrate a correlation between thermal conductivity and the kinematic viscosity of various samples of unconventional hydrocarbon fluids on thermal conductivity as a measure of suitability as a thermal management fluid. The kinematic viscosities of the sampled thermal management fluids were measured in accordance with ASTM D445. The thermal conductivity of the sampled thermal management fluids was measured in accordance with ASTM D7896 and the like.

Table 1 organizes the sampled thermal management fluids based on descriptions of similar chemistries. The sampling groups include thermal management fluids containing paraffins, hydrogenated trimers, polyalphaolefins, and hydrocarbon fluids.

TABLE 1

Chemical description of non-aqueous hydrocarbon thermal management fluid samples.

| Sample | Description |
|---|---|
| 1 (comparative) | $C_{20}$ methyl paraffin |
| 2 (comparative) | Decene trimer, hydrogenated |
| 3 (comparative) | Polyalphaolefin |
| 4 (comparative) | $C_{16}$ methyl paraffin |
| 5 (comparative) | Octene trimer, hydrogenated |
| 6 (comparative) | N-paraffinic, isoparaffinic and naphthenic hydrocarbon fluid, predominantly C13-C18 |
| 7 (comparative) | Predominantly isoparaffinic hydrocarbon fluid, highly branched, C12-C16 |
| 8 (comparative) | Predominantly isoparaffinic hydrocarbon fluid, predominantly, C12-C16 |
| 9 (comparative) | N-paraffinic, isoparaffinic an naphthenic Hydrocarbon fluid, predominantly C12-C16 |
| 10 (comparative) | Predominantly isoparaffinic hydrocarbon fluid, highly branched, C14-C20 |
| 11 | Isoparaffinic and naphthenic hydrocarbon fluid, predominantly C14-C25 |
| 12 (comparative) | Isoparaffinic and naphthenic hydrocarbon fluid, predominantly C14-C23 |
| 13 | Isoparaffinic and naphthenic hydrocarbon fluid, predominantly C10-13 |

FIG. 1 illustrates the results of this example. The graphical comparison was generated to enable comparison of sampled thermal management fluids with different viscosities. As illustrated in FIG. 1, samples with the same chemistry and chemical description trended with an increase in thermal conductivity as kinematic viscosity increased.

Example 2

From the sampled thermal management fluids of Example 1, sample sets were further narrowed based on similar kinematic viscosities. Within the similar kinematic viscosities, the general correlation between kinematic viscosity and thermal conductivity was compared. However, among the sampled sets, the sample with the highest kinematic viscosity was not the sample with the highest thermal conductivity. Branch content was another property of the sampled thermal management fluids as a measure of comparison to determine high thermal conductivity was used. The example also included the predicted thermal conductivity as well as the deviation of thermal conductivity. The predicted thermal conductivity In Table 2, a group of the sampled thermal management fluids were analyzed with kinematic viscosities of about 2 $mm^2/s$ to about 4 $mm^2/s$. In comparison, although Sample 6 had the highest kinematic viscosity, it did not have the highest thermal conductivity. Sample 4 had the highest thermal conductivity, but the lowest branch content and no naphthene content.

TABLE 2

Branch content of sample thermal management fluids with similar kinematic viscosity @ 40° C.

| Sample | KV40 ($mm^2/s$) | Thermal conductivity at 5 $mm^2/s$ (mW/mK) | Branch content (mol. %) | Naphthene content (wt. %) |
|---|---|---|---|---|
| 9 (comparative) | 2.08 | 122 | 10.8 | 55.3 |
| 8 | 2.22 | 120 | 22.4 | 14 |
| 4 (comparative) | 2.77 | 137 | 6.3 | 0 |
| 7 (comparative) | 3.02 | 106 | 31.3 | 14.7 |
| 6 (comparative) | 3.63 | 116 | 11.9 | 69.2 |

In Table 3, a group of the sampled thermal management fluids were analyzed with kinematic viscosities of about 5 $mm^2/s$ to about 6 $mm^2/s$. Although Sample 1, a methyl paraffin, had the lowest kinematic viscosity, Sample 1 had the highest thermal conductivity. Sample 1 also had the lowest branch content with no naphthene content.

TABLE 3

Branch content of sample thermal management fluids with similar kinematic viscosity @ 40° C.

| Sample | KV40 ($mm^2/s$) | Thermal conductivity at 5 $mm^2/s$ (mW/mK) | Branch content (mol. %) | Naphthene content (wt. %) |
|---|---|---|---|---|
| 1 (comparative) | 4.99 | 139 | 5.0 | 0 |
| 3 (comparative) | 5.06 | 132 | 9.0 | 0 |
| 12 (comparative) | 5.8 | 117 | 13.5 | 69.8 |

In Table 4, the sampled thermal management fluids had kinematic viscosities of about 7 $mm^2/s$ to about 8 $mm^2/s$. Sample 5 had the higher thermal conductivity, but the lesser branch content and no naphthene content.

TABLE 4

Branch content of sample thermal management fluids with kinematic @ 40° C.

| Sample | KV40 ($mm^2/s$) | Thermal conductivity at 5 $mm^2/s$ (mW/mK) | Branch content (mol. %) | Naphthene content (wt. %) |
|---|---|---|---|---|
| 10 (comparative) | 7.64 | 102 | 32.7 | 25.8 |
| 5 (comparative) | 7.8 | 131 | 8.3 | 0 |

In Table 5, the sampled thermal management fluids had kinematic viscosities greater than 8 $mm^2/s$. In comparison, Sample 2, had the higher kinematic viscosity and higher thermal conductivity than sample 8. Sample 2 also had the lower branch content and no naphthene content.

TABLE 5

Branch content of sample thermal management fluids with similar kinematic viscosity @ 40° C.

| Sample | KV40 ($mm^2/s$) | Thermal conductivity at 5 $mm^2/s$ (mW/mK) | Branch content (mol. %) | Naphthene content (wt. %) |
|---|---|---|---|---|
| 11 (comparative) | 8.16 | 120 | 13.4 | 65.7 |
| 2 (comparative) | 13.45 | 136 | 6.7 | 0 |

Example 3

An example analyzed the measured thermal conductivity at 5 $mm^2/s$ to the branch content of the fluid samples. A regression model was developed to calculate a predicted thermal conductivity based on a branch content. FIG. 2 illustrates the results of this example. Table 6 organizes the calculated predicted thermal conductivity data from FIG. 2 of this examples. The deviation of the thermal conductivity of the predicted and measured ranged from about −5% to about 10%.

TABLE 6

Predicted thermal conductivities and deviation of thermal conductivities of sample thermal management fluids from branch content.

| Sample | Branch Content (mol. %) | Predicted thermal conductivity at 5 $mm^2/s$ (mW/mK) | Deviation of thermal conductivity at 5 $mm^2/s$ from prediction (%) |
|---|---|---|---|
| 1 (comparative) | 5 | 141 | −1.3 |
| 2 (comparative) | 6.7 | 134 | 1.4 |
| 3 (comparative) | 9 | 128 | 3.4 |
| 4 (comparative) | 6.3 | 136 | 0.8 |
| 5 (comparative) | 8.3 | 129 | 1.3 |
| 6 (comparative) | 11.9 | 122 | −4.7 |
| 7 (comparative) | 31.3 | 103 | 2.7 |

TABLE 6-continued

Predicted thermal conductivities and deviation of thermal conductivities of sample thermal management fluids from branch content.

| Sample | Branch Content (mol. %) | Predicted thermal conductivity at 5 mm$^2$/s (mW/mK) | Deviation of thermal conductivity at 5 mm$^2$/s from prediction (%) |
|---|---|---|---|
| 8 | 22.4 | 109 | 9.6 |
| 9 (comparative) | 10.8 | 124 | −1.6 |
| 10 (comparative) | 32.7 | 103 | −0.8 |
| 11 (comparative) | 13.4 | 119 | 0.4 |
| 12 (comparative) | 13.5 | 119 | −1.8 |
| 13 | 21.5 | 110 | 8.8 |

While the disclosure has been described with respect to a number of embodiments and examples, those skilled in the art, having benefit of this disclosure, will appreciate that other embodiments can be devised which do not depart from the scope and spirit of the invention as disclosed herein. Although individual embodiments are discussed, the invention covers all combinations of all those embodiments.

Where a range of values is provided, it is understood that each intervening value, to the tenth of the unit of the lower limit unless the context clearly dictates otherwise (such as in the case of a group containing a number of carbon atoms in which case each carbon atom number falling within the range is provided), between the upper and lower limit of that range and any other stated or intervening value in that stated range is encompassed within the disclosure. The upper and lower limits of these smaller ranges may independently be included in the smaller ranges is also encompassed within the disclosure, subject to any specifically excluded limit in the stated range. Where the stated range includes one or both of the limits, ranges excluding either both of those included limits are also included in the disclosure.

It should also be understood that, unless clearly indicated to the contrary, in any methods claimed herein that include more than one step or act, the order of the steps or acts of the method is not necessarily limited to the order in which the steps or acts of the method are recited.

The following terms are used to describe the present disclosure. In instances where a term is not specifically defined herein, that term is given an art-recognized meaning by those of ordinary skill applying that term in context to its use in describing the present disclosure.

The articles "a" and "an" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

The term "about" or "approximately" means an acceptable experimental error for a particular value as determined by one of ordinary skill in the art, which depends in part on how the value is measured or determined. All numerical values within the specification and the claims herein are modified by "about" or "approximately" the indicated value, and take into account experimental error and variations that would be expected by a person having ordinary skill in the art.

The phrase "major amount" or "major component" as it relates to components included within the thermal management fluid of the specification and the claims means greater than or equal to 50 wt. %, or greater than or equal to 60 wt. %, or greater than or equal to 70 wt. %, or greater than or equal to 80 wt. %, or greater than or equal to 90 wt. % based on the total weight of the thermal management fluid. The phrase "minor amount" or "minor component" as it relates to components included within the thermal management fluid of the specification and the claims means less than 50 wt. %, or less than or equal to 40 wt. %, or less than or equal to 30 wt. %, or greater than or equal to 20 wt. %, or less than or equal to 10 wt. %, or less than or equal to 5 wt. %, or less than or equal to 2 wt. %, or less than or equal to 1 wt. %, based on the total weight of the thermal management fluid. The phrase "substantially free" or "essentially free" as it relates to components included within the thermal management fluids of the specification and the claims means that the particular component is at 0 weight % within the lubricating oil, or alternatively is at impurity type levels within the lubricating oil (less than 100 ppm, or less than 20 ppm, or less than 10 ppm, or less than 1 ppm).

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

As used herein in the specification and in the claims, the phrase "at least one," in reference to a list of one or more elements, should be understood to mean at least one element selected from anyone or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

What is claimed is:

1. A thermal management fluid for use in an electric system comprising:
   a base oil as a major component, wherein the base oil comprises:
      (i) a branch content of about 22 mol % to about 30 mol %, wherein the branch content is a tertiary carbon content of the base oil; and
      (ii) a naphthene content of about 30 wt. % or less;
   wherein the thermal management fluid has a thermal conductivity at kinematic viscosity of 5 mm$^2$/s at least about 5% greater than a predicted thermal conductivity characterized by the following regression model equation:

$$TC_{Pred}=84.873*(BC)^{-0.17}$$

wherein $TC_{Pred}$ is the predicted thermal conductivity measured in mW/mK, and BC is the branch content of the base oil.

2. The thermal management fluid of claim 1, wherein the electric system is part of an electric vehicle.

3. The thermal management fluid of claim 1, wherein the electric system comprises an electric motor.

4. The thermal management fluid of claim 1, wherein the electric system comprises a battery.

5. The thermal management fluid of claim 1, wherein the thermal management fluid is in direct contact with one or more electrified components of the electric system to remove heat from the one or more electrified components.

6. The thermal management fluid of claim 1, wherein the naphthene content of the base oil is about 25 wt. % or less.

7. The thermal management fluid of claim 1, wherein the thermal management fluid has a thermal conductivity of about 110 mW/mK or greater at a kinematic viscosity of 5 mm$^2$/s.

8. The thermal management fluid of claim 1, further comprising one or more additives selected from the group consisting of an antioxidant, a corrosion inhibitor, an antifoam agent, an anti-wear additive, a dispersant, a detergent, a viscosity modifier, and any combination thereof.

9. The thermal management fluid of claim 1, further comprising:
   at least one phenol-based antioxidant present in an amount of about 0.25 wt. % or greater, and
   at least one amine-based antioxidant present in an amount of about 0.1 wt. % or greater.

10. The thermal management fluid of claim 1, further comprising:
    at least one phenol-based antioxidant present in an amount of about 0.5 wt. % or greater, and
    at least one amine-based antioxidant present in an amount of about 0.2 wt. % or greater.

11. A method of cooling an electric system, comprising:
    circulating a thermal management fluid according to claim 1 into a contact with one or more components of the electric system to remove heat from the one or more components.

12. The method of claim 11, wherein the electric system is part of an electric vehicle.

13. The method of claim 11, wherein the one or more components comprise an electric motor.

14. The method of claim 11, wherein the one or more components comprise a battery.

15. The method of claim 11, wherein the contact is a direct contact with the electric system for heat removal.

16. The method of claim 11, wherein the circulating further comprises circulating the thermal management fluid through a heat exchanger after the thermal management fluid has contacted the one or more components of the electric system.

17. The method of claim 11, wherein the thermal management fluid further comprises one or more additives selected from the group consisting of an antioxidant, a corrosion inhibitor, an antifoam agent, an anti-wear additive, a dispersant, a detergent, a viscosity modifier, and any combination thereof.

18. The method of claim 11, wherein the thermal management fluid further comprises:
    at least one phenol-based antioxidant present in an amount of about 0.25 wt. % or greater, and
    at least one amine-based antioxidant present in an amount of about 0.1 wt. % or greater.

19. The method of claim 11, wherein the thermal management fluid further comprises:
    at least one phenol-based antioxidant present in an amount of about 0.5 wt. % or greater, and
    at least one amine-based antioxidant present in an amount of about 0.2 wt. % or greater.

20. The method of claim 11, wherein the naphthene content of the base oil is 25 wt. % or less.

* * * * *